United States Patent [19]

Hill, Jr.

[11] 4,201,895

[45] May 6, 1980

[54] PASSIVE AUDIO SIGNAL MIXING APPARATUS

[76] Inventor: Harold W. Hill, Jr., 512 Portland Ave., Pleasantville, N.J. 08232

[21] Appl. No.: 816,079

[22] Filed: Jul. 15, 1977

[51] Int. Cl.² .................. G11B 27/00; G11B 31/00
[52] U.S. Cl. ............................ 179/100.1 R; 360/13
[58] Field of Search ............ 179/100.1 A, 100.1 TD, 179/100.1 R, 1 SW, 1 VL, 100.11, 100.1 PS; 360/13, 61

[56] References Cited

U.S. PATENT DOCUMENTS

| | | | |
|---|---|---|---|
| 2,110,358 | 3/1938 | Dreisbach | 179/1 |
| 2,182,192 | 12/1939 | Becker | 179/1 VL |
| 2,499,603 | 3/1950 | Mueller | 179/100.1 R |
| 2,530,251 | 11/1950 | Luberoff | 84/170 |
| 2,530,252 | 11/1950 | Luberoff | 84/1.02 |
| 2,995,630 | 8/1961 | Kabrick | 179/100.1 |
| 3,295,853 | 1/1967 | Cheng | 360/15 |
| 3,809,812 | 5/1974 | Smith | 179/1 SW |
| 3,914,549 | 10/1975 | Bose | 179/1 G |
| 4,021,614 | 5/1977 | Bubbers | 179/1 VL |

OTHER PUBLICATIONS

Schematic Diagram–Lafayette, Disc/Mic Mixer, Stock No. 99-46955 W.
Schematic Diagram–Pioneer MA-62.
Audio Cyclopedia, by H. M. Tremaine, © 1969 by Howard W. Sams & Co., Inc., pp. 405, 406, 414–416.

*Primary Examiner*—Bernard Konick
*Assistant Examiner*—Alan Faber
*Attorney, Agent, or Firm*—Schwartz, Jeffery, Schwaab, Mack, Blumenthal & Koch

[57] ABSTRACT

An audio signal mixing apparatus requiring no active elements, for a conventional audio amplifier unit having a tape monitor function. Low level signal inputs are level-controlled by potentiometers, mixed, and supplied to the phono input of the conventional amplifier. With the conventional amplifier unit set in the phono and tape monitor modes, the mixed low level signal is preamplified by the input amplifier stage of the amplifier unit and provided to the tape monitor output of the amplifier unit. High level inputs to the mixing apparatus are controlled by respective potentiometers and mixed before being supplied to the high level input of the conventional amplifier unit. A switch in the mixing device allows the preamplified signals from the tape monitor output of the amplifier unit to be combined with the high level inputs and provided to the tape input of the conventional amplifier unit. In this way, the mixing apparatus may be made completely passive without requiring all audio program sources to provide signals of substantially equal level and impedance characteristics.

17 Claims, 2 Drawing Figures

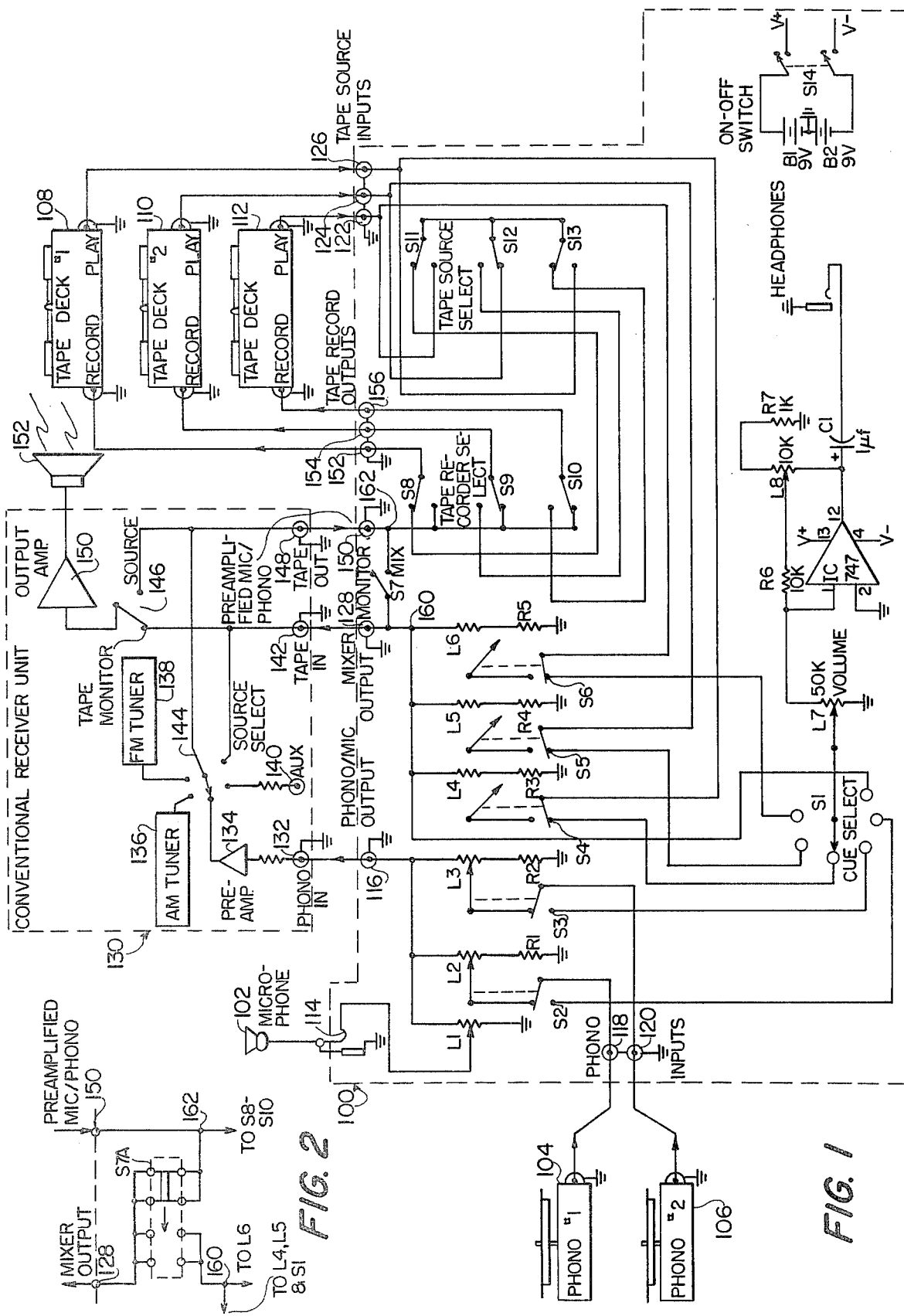

PASSIVE AUDIO SIGNAL MIXING APPARATUS

BACKGROUND OF THE INVENTION

1. Field of the Invention

The invention relates to the passive processing of audio signals from a plurality of sources having substantially different signal levels, and for allowing selective mixing of the signals for subsequent amplification.

2. The Prior Art

Devices for selective mixing of audio signals from a plurality of sources are well known in the art. Such mixers may be divided generally into two types. A first type is the active mixer which has amplification and equalization circuitry for accepting signals from sources having differing output characteristics, in particular having different output signal levels and output impedances. Such mixing devices have active elements which serve to generally equalize the signal levels and output impedances prior to mixing, so that the signals to be mixed are of substantially comparable characteristics and may be provided to a single output amplifier. One such active mixer is the "DISC/MIC MIXER" manufactured by Lafayette Radio Corporation of New York and sold under stock No. 99-46955W. Another such mixer having active elements is Type MA-62, manufactured by Pioneer Radio Corporation of Japan.

A mixing device having active elements is further shown in the audio signal programming apparatus of U.S. Pat. No. 2,995,630, wherein a preamplifier is provided between a microphone and a mixing switch arrangement, while no such preamplifier is provided between a phonograph turntable and the mixing switch arrangement.

The second general type of mixing system requires that signals of substantially equal characteristics be supplied thereto from the respective audio signal sources in order to avoid deterioration in output quality. Such systems are shown, for example, in U.S. Pat. Nos. 3,809,812 and 2,110,358. Further devices, such as those shown in U.S. Pat. Nos. 2,530,251 and 2,530,252, have a plurality of sources of differing signal characteristics, but provide one or more preamplifiers for equalizing the signal characteristics.

Aside from the mixing devices, amplifier units are known in the art which have tape monitoring functions. Such amplifier units comprise generally a plurality of input terminals for receiving various input source signals along with one or more preamplifiers for equalizing some of the input signals before supplying such signals to an output audio amplifier stage. Many such amplifier units have an arrangement of switches (or a single rotary switch) whereby a low level signal input, such as a phono or microphone input, is coupled to a preamplifier stage. The preamplifier stage output is in turn coupled to a tape monitor output. At the same time, a tape input terminal of the amplifier unit may be selectively coupled to the input of the audio output amplifier via a tape monitor switch.

Such an arrangement is conventionally used for monitoring the tape recording of a signal from a low-level signal source. For example, a phono pickup is coupled to the phono input and preamplified within the amplifier unit, the output of the preamplifier stage being supplied via the tape monitor output to the record head of a tape recorder. At the same time, the tape recorder output (such as from a record monitor head on the tape recorder) is coupled to the tape recorder input of the amplifier unit and supplied via the tape monitor switch and the audio output amplifier to a headphone or speaker. In this manner, the operator can monitor the signal transferred from the phonograph to the tape recorder with the phonograph output signal being preamplified prior to recording.

This use of the tape monitor feature of a conventional amplifier has been used to further advantage by the coupling of an active equalizer between the amplifier unit and the tape recorder as taught in U.S. Pat. No. 3,914,549. However, none of the aforementioned prior art arrangements teaches a passive mixing apparatus which makes use of the tape monitor feature of conventional amplifier or receiver units to permit mixing of program material from a plurality of sources having dissimilar signal characteristics.

SUMMARY OF THE INVENTION

The present invention comprises a passive circuit arrangement for the mixing of audio program signals from a plurality of sources, some of the sources having relatively high level output signals and other of the sources having relatively low level output signals. The apparatus is designed for use with a conventional amplifier or receiver unit having a tape monitor function which permits low level signals to be supplied to a preamplifier stage within the unit and fed out at a tape monitor output. Low level signals may be mixed prior to being applied to the preamplifier stage of the unit, retrieved from the tape monitor output and mixed with relatively high level audio signals from other sources such as tape playback units having integrally constructed preamplifiers for the playback heads. The resultant mixture may then be provided to a high level input of the amplifier unit (such as a "tape" or "auxiliary" input), for subsequent processing in the audio output amplifier stage of the conventional amplifier or receiver unit. Special features of the present invention include the use of switches to permit selective transfer of audio signals from the tape monitor output or from the high level sources to tape recorder inputs, as well as a cueing monitor switch for permitting monitoring of a program source output prior to mixing such source with the source outputs.

BRIEF DESCRIPTION OF THE DRAWINGS

FIG. 1 shows a preferred embodiment of the passive, audio signal mixing apparatus of the present invention; and FIG. 2 shows a modification which can be made in the apparatus of FIG. 1.

DETAILED DESCRIPTION OF THE PREFERRED EMBODIMENT

Shown generally at 100 in FIG. 1 is the preferred circuit arrangement for providing passive mixing of audio signals from a variety of sources having different output characteristics. Such sources may include, for example, a microphone 102, the pickups from one or more phonograph players 104, 106 and the outputs from one or more tape players 108, 110, and 112.

In the preferred embodiment, the output of microphone 102 is fed into mixer 100 via a jack 114. Jack 114 is coupled to the sliding contact of a manually operable level controller (potentiometer) L1. The remaining terminals of controller L1 are connected to ground and to a phono/microphone output terminal 116, respectively. The additional low level signals from the pickups of phonographs 104, 106 are coupled via respective phono inputs 118, 120 and switches S2, S3 to the sliding contacts of level controllers L2, L3, as shown. The remaining terminals of controllers L2, L3 are connected to the phono/microphone output terminal 116 and through respective resistors R1, R2 to ground.

It can thus be seen that the low level input signals provided directly from the microphone 102 and from the pickups of phonograph players 104, 106 are first level controlled by manual operation of the corresponding level controllers L1-L3. The low level outputs of these level controllers are passively mixed at phono/mic output 116.

The output of each of the tape deck players 108-112 is coupled through a respective one of input terminals 122, 124, 126 and through a respective one of switches S4, S5, S6 to one of the level controllers L4, L5, L6. The suitably mixed tape deck signals, which have a high level relative to the phono and microphone inputs, are mixed passively and supplied to mixer output terminal 128.

A conventional amplifier or receiver unit having a tape monitor switch is shown generally at 130. The receiver unit comprises a phono input 132 which is supplied to a preamplifier stage 134. The receiver unit may have integrally constructed tuners 136, 138 for AM and FM radio reception. These tuners may, of course, be separately packaged from the unit 130 and suitable inputs may be provided in unit 130. Additional input terminals 140, 142 are provided for receiving relatively high level audio signals. The conventional receiver unit ordinarily includes a switch 144 for selecting the desired source of program material. That is, the listener may choose between the phono source input 132, the AM tuner 136, the FM tuner 138, the auxiliary input 140 or the tape input 142. The source selected is coupled to the source contact of a tape monitor switch 146 as well as to an output terminal 148. The output terminal 148 may be used, for example, for tape recording of the selected source material. A tape monitor switch 146 is connected as shown and is ordinarily set in the "source" position so that the selected program material is coupled to an output amplifier stage 150 which drives one or more loudspeakers 152. However, the tape monitor switch 146 has an additional contact position which allows the output amplifier stage 150 to be coupled to the tape input terminal 142, as shown. With switch 146 in the position shown, the program material from source selector switch 144 is coupled only to the tape output 148, and is not coupled to output amplifier stage 150.

With source selector switch 144 and tape monitor switch 146 positioned as shown, the advantageous operation of the present invention can be obtained. The receiver unit 130 is fed with the mixed and level-controlled phono/mic signal at phono input 132. This low level signal mixture is processed by preamplifier 134 and sent through source selector switch 144 to tape output 148 of the receiver unit. The signal from output 148 is provided to an input terminal 150 of mixer 100. If it is desired to have only information from tape decks 108-112 supplied at loudspeaker 152, the mix/monitor switch S7 (which couples terminals 128 and 150) may be left in the monitor position, as shown. In this state, the signal provided at mixer output 128 comprises only the mixed and level-controlled tape source signals, and such mixed signals are provided to receiver unit input 142 and coupled to output amp 150 and loudspeaker 152. If it is desired further to mix signals from microphone 102 or phono players 104, 106, the mix/monitor switch S7 may be placed in the alternate position so that the preamplified phono/microphone signal from tape output 148 of the receiver unit is passively mixed at switch S7 with the tape deck signals.

It is to be noted that, due to preamplifier 134, the mixed phono/mic signal at tape output 148 is substantially equalized with respect to the high level signals from tape decks 108-112. Therefore, passive mixing of the microphone, phono and tape signals may be effected without loss of signal quality.

It can be seen from the foregoing description that mixing of signals from audio signal sources having dissimilar output characteristics can be advantageously done with passive devices, thereby eliminating the requirement for having audio signal sources with substantially equalized signal outputs and further reducing the cost and complexity of the mixing apparatus. Because use is made of the preamplifier stage of the conventional amplifier or receiver unit, no preamplifiers are required in the mixing apparatus. The potentiometers may be relatively inexpensive 10K ohm devices, with L2-L6 being coupled to ground through 15 ohm fixed resistors R1-R5.

Additional features are desirably included in the preferred embodiment of the present invention. Such features include means for multiple channel operation, for selectively recording audio signals from one or more of the audio program sources, and for permitting the user of the apparatus to monitor one program source while another is being played through the output amplifier 150 of the conventional amplifier or receiver unit 130.

It is to be noted that each of switches S2-S6 has a second terminal to which the program source is coupled when the corresponding level controller L2-L6 is in the minimum signal output position. That is, when the sliding contact of the potentiometer is placed in its lowest position (as shown for L4-L6), a switch coupled mechanically to the slider causes the program source material to be decoupled from the potentiometer slider and to be coupled to a respective contact of cue selecting switch S1. Such potentiometer-mounted switches are well known in the art and readily available commercially. By appropriate setting of switches S2-S6 and the contact of a rotary switch S1, program material from the phono, or tape sources can be monitored by means of an amplifier circuit and headphones, as can the mixer output signal at terminal 128.

It can be seen from FIG. 1 that the output of switch S1 passes through a volume control potentiometer L7 and an operational amplifier to a headphone jack. The operational amplifier may comprise an integrated circuit of type 747 which is provided with suitable power supply and biasing components R6, R7 and L8. An output capacitor C1 provides the monitored signal information to a headphone jack or the like. Although the cueing monitor amplifier is shown as being an integral portion of the present mixing apparatus, it will be understood by those skilled in the art that the mixing device of the present invention may simply have an output jack provided directly from switch S1. In such case the output of switch S1 would be suitably amplified in a separately packaged amplifier. For example, a headphone set having a built-in amplifier may be used with the mixing device of the present invention, and the amplifier type IC747 may be entirely deleted from the mixing circuit shown.

The preferred embodiment shown in FIG. 1 advantageously has additional output terminals 152, 154 and 156 for permitting tape recording of individual or mixed program material. Each of these tape recording outputs is coupled to a respective one of switches S8, S9 and S10, as shown. With one of switches S8–S10 in the lower position (such as shown in S9), the corresponding output 154 is coupled to the signal appearing at terminal 150 of the mixer. Thus, with switches S7–S10 in the positions shown, tape decks 110, 112 may record the mixed and preamplified signal obtained from tape output 148 of receiver unit 130. If it is desired to also record a level-controlled mixture of the tape sources, mix/monitor switch S7 may be closed and such material will be mixed with the program material from tape output 148 prior to recording.

Each of switches S8–S10 has a second position which permits connection with a respective one of a bank of switches S11, S12 and S13. By appropriate selection of switch positions of switches S8–S13, program material may be directly transferred from one tape deck source to another without passage through the level controlling devices. For example, with the switches in the positions shown, program materials supplied from tape deck 110 through input 124 will pass serially through switches S12, S11 and S8 and output 152 for recording in tape deck 108.

It can be seen from the foregoing that program material from one or more sources may be level controlled, mixed and provided to output amp 150, while at the same time unmixed program material may be transferred directly from one tape deck to another. The operator can also simultaneously monitor any of the sources individually, or may monitor the mixed signal output at terminal 128.

Those skilled in the art will recognize that the mixer device 100 described in detail above provides a great deal of flexibility and ease of operation, while maintaining the cost and complexity of the apparatus at a relatively low level. Program sources having dissimilar characteristics may be easily and advantageously mixed in any desired proportions without sacrificing signal quality, requiring separate preamplifiers for some or all sources, or requiring that the program sources have substantially uniform characteristics.

It will be further understood that the circuit arrangement shown in FIG. 1 is for a single channel only, but that multiple channels may be employed. For example, each of the program sources may comprise a two-, three-, four-, or other multi-channel source. The conventional receiver unit 130 may, of course, also be a multi-channel unit having a separate group of the described input and output terminals and preamplifier and output amplifier stages for each such channel. When such multichannel operation is preferred, the mixing apparatus 100 may similarly have multiple, parallel channels for processing the program material. In such case, the level controllers, switches and the like may be mechanically linked to provide simple simultaneous operation for the parallel channels as is well known in the art. Further means for adapting the described single-channel system for multi-channel operation will be apparent to those skilled in the art.

A further embodiment of the present invention will now be described with reference to FIGS. 1 and 2. As can be seen in FIG. 1, junction 160 is coupled to terminal 128 and junction 162 is coupled to terminal 150, thereby allowing the above-described operation of mix/monitor switch S7. It will be recognized, however, that the operation of switch S7 of FIG. 1 does not permit only the pre-amplified mic/phono signal from output 148 of unit 130 to be returned to tape input 142 of unit 130, unless all of level controllers L4–L6 are in the positions shown.

In view of this limitation of the FIG. 1 embodiment, a modification of the mix/monitor switch is shown in FIG. 2 which permits more varied operation of the passive mixer 100. With the FIG. 2 modification, the single pole-double throw mix/monitor switch S7 of FIG. 1 is replaced with a four pole-triple throw slide switch S7A. The switch S7A is connected as shown, with all four contacts on the output side of the switch coupled to terminal 128. The two terminals on the left side of the switch input are coupled to junction 160 (the jumper between junction 160 and terminal 128 of FIG. 1 being broken for the FIG. 2 embodiment), and the two terminals on the right side of the switch input are coupled to junction 162.

In operation, the slider of mix/monitor switch S7A may be placed in the desired one of three possible positions so as to contact either the four right-hand switch contacts (as shown), the four center switch contacts, or the four left-hand switch contacts. The pre-amplified mic/phono signal from output 148 of unit 130 is coupled through mixer input terminal 150, junction 162, switch S7A and mixer output terminal 128 to tape input 142 of unit 130 with the slider of switch S7A in the position shown. Therefore only the mixed and preamplified mic/phono signal is provided to output amplifier 150.

With the slider of switch S7A in the far left-hand position only the mixed high level signals from junction 160 are provided to output amp 150, while with the slider switch S7A in the center position both the mixed high level signals from junction 160 and the mixed and preamplified mic/phono signals from junction 162 are provided to output amplifier 150.

Those skilled in the art will recognize that numerous modifications may be made within the spirit and scope of the present invention. For example, either switch S7 or switch S7A may be replaced with suitable rotary or other type switches capable of performing the intended functions. The scope of the invention is accordingly defined by the following claims.

I claim:

1. Separately-packaged audio signal mixing apparatus for use with a plurality of separately-packaged audio signal sources, at least one said source providing a low level audio signal and at least one source providing a high level audio signal, and for use with a separately-packaged conventional audio amplifier unit having an input coupled to a preamplifier for low level signal, an input for high level signals, an audio output amplifier, a tape monitor signal output, and means for selectively coupling said preamplifier output signal to said tape monitor signal output and for selectively coupling said high level signal input to said output amplifier, the apparatus comprising:

a separate input for receiving each said low level audio signal;

passive, manually operable means coupled to each said low level signal input for selectively controllig the respective input signal level;

a first output;

a first junction for passively mixing and supplying as a single signal the mixed, level-controlled low level signals through said first output to the low level signal input of said separately-packaged amplifier unit;

a separate input for receiving each said high level audio signal;

passive, manually operable means coupled to each high level signal input for selectively controlling the respective input signal level;

a second output;

a second junction for passively mixing and supplying as a single signal the mixed, level-controlled high level signals through said second output to the high level signal input of said separately-packaged amplifier unit;

an input for receiving said mixed, level-controlled, low-level signals in pre-amplified form from said tape monitor output of said separately-packaged amplifier unit; and manually operable means for selectively coupling one or both of said pre-amplified signal and said mixed, level-controlled high level signal to said second output, whereby said low level audio source signals may be selectively level controlled and mixed in said separately-packaged mixing apparatus and preamplified in said separately-packaged amplifier unit to a level suitable for passive mixing with said high level audio source signals, said high level audio source signals may be selectively level controlled and mixed in said separately-packaged mixing apparatus, and the preamplified mixture of low level audio source signals may be selectively mixed with the mixture of high level audio source signals in said separately-packaged mixing apparatus and supplied to said audio output amplifier.

2. The audio signal mixing apparatus of claim 1, wherein at least two of said separately-packaged high level audio signal sources are provided and comprise audio tape recording and playback units having respective playback signal outputs and record signal inputs, said separately-packaged mixing apparatus further comprising means for selectively coupling the playback signal output of one said recorder to the record signal input of the other said recorder, or vice versa, whereby information signals may be transferred from one said recorder unit to the other.

3. The audio signal mixing apparatus of claim 1 wherein at least one of said separately-packaged high level audio signal sources comprises an audio tape recording and playback unit having a record signal input, said mixing apparatus further comprising means for selectively coupling the pre-amplified signal from said amplifier unit tape monitor output to said record signal input.

4. The audio signal mixing apparatus of claim 1, wherein said separately-packaged audio signal sources are multiple-channel sources and said separately-packaged conventional audio amplifier unit is a multiple channel unit having duplicate inputs, outputs and selective coupling means for the respective channels, said mixing apparatus further comprising for each channel a respective circuit comprising said low level inputs, said low level signal controlling means, said low level signal output, said high level inputs, said high level signal controlling means, said high level signal output, said pre-amplified signal input and said manually operable selective coupling means.

5. The audio signal mixing apparatus of claim 1 wherein at least one said separately-packaged low level audio signal source comprises a microphone.

6. The audio signal mixing apparatus of claim 1 wherein at least one said separately-packaged low level audio signal source comprises a phonograph pickup.

7. The audio signal mixing apparatus of claim 1 wherein each said passive, manually operable level controlling means comprises a potentiometer having a manually operable sliding contact coupled to receive the respective audio signal, a first fixed terminal coupled to ground, and a second fixed terminal coupled to provide the respective level-controlled audio signal.

8. The audio signal mixing apparatus of claim 1 wherein each said passive, manually operable level controlling means comprises switch means for selectively coupling and decoupling the respective audio signal from said mixing apparatus.

9. The audio signal mixing apparatus of claim 1, further comprising a cueing monitor output line and means for selectively coupling one of said low level audio signal inputs, one of said high level audio signal inputs, or said second mixing apparatus output to said cueing monitor output.

10. The audio signal mixing apparatus of claim 9, further comprising means for amplifying the signal supplied to said cueing monitor output.

11. The audio signal mixing apparatus of claim 1 wherein said manually operable signal coupling means comprises a doublethrow switch connected for coupling only said mixed, level-controlled high level signal from said second junction to said second output when in a first position and for connecting both said mixed, level-controlled high level signal from said second junction and said pre-amplified signal from said amplifier unit tape monitor output to said second output when in a second position.

12. The audio signal mixing apparatus of claim 1 wherein said manually operable signal coupling means comprises a triplethrow switch connected for coupling only said mixed, level-controlled high level signal from said second junction to said second output when in a first position, for coupling only said pre-amplified signal from said amplifier unit tape monitor output to said second output when in a second position, and for coupling both said mixed, level-controlled high level signal from said second junction and said pre-amplified signal from said amplifier unit tape monitor output to said second output when in a third position.

13. An arrangement for mixing signals from a plurality of audio signal sources, comprising in combination:
(a) a plurality of separately-packaged audio signal sources, at least one said source providing a low level audio signal and at least one said source providing a high level audio signal;
(b) a separately-packaged audio amplifier unit comprising:
a preamplifier having an input for low level signals;
an input for high level signals; an audio output amplifier;
a tape monitor signal output; and
means for selectively coupling said preamplifier output signal to said tape monitor signal output and for selectively coupling said high level signal input to said output amplifier; and
(c) a separately-packaged passive audio signal mixing apparatus comprising:
a separate input coupled to each said low level audio signal source for receiving a respective low level audio signal;

passive, manually operable means coupled to each said low level signal input for selectively controlling the respective input signal level; a first output coupled to said preamplifier low level signal input;

a first junction for passively mixing and supplying as a single signal the mixed, level-controlled low level signals through said first output to said preamplifier low level input;

a separate input coupled to each said high level audio signal source for receiving a respective high level audio signal;

passive, manually operable means coupled to each said high level signal input for selectively controlling the respective input signal level;

a second output coupled to said audio amplifier unit higher level signal input;

a second junction for passively mixing and supplying as a single signal the mixed, level-controlled high level signals through said second output to said amplifier unit high level signal input;

an input for receiving said mixed, level-controlled, low level signals in preamplified form from said amplifier unit tape monitor output; and manually operable means for selectively coupling one or both of said preamplified, mixed, level controlled, low level signal and said mixed, level-controlled high level signal to said second output, whereby said low level audio source signals may be selectively level controlled and passively mixed in said separately-packaged mixing apparatus and preamplified in said separately-packaged amplifier unit to a level suitable for passive mixing with said high level audio source signals, said high level audio source signals may be selectively level controlled and passively mixed in said mixing apparatus, and the preamplified mixture of low level audio source signals may be selectively, passively mixed with the mixture of high level audio source signals in said mixing apparatus and subsequently supplied to said audio output amplifier.

14. The audio signal mixing apparatus of claim 13, wherein at least two of said separately-packaged high level audio signal sources are provided and comprise audio tape recording and playback units having respective playback signal outputs and record signal inputs, said separately-packaged mixing apparatus further comprising means for selectively coupling the playback signal output of one said recorder to the record signal input of the other said recorder or vice versa, whereby information signals may be transferred from one said recorder unit to the other.

15. The audio signal mixing apparatus of claim 13, wherein at least one of said separately-packaged high level audio signal sources comprises an audio tape recording and playback unit having a record signal input, said separately-packaged mixing apparatus further comprising means for selectively coupling the preamplified signal from said amplifier unit tape monitor output to said record signal input.

16. The audio signal mixing apparatus of claim 13, wherein said manually operable signal coupling means comprises a double-throw switch connected for coupling only said mixed, level-controlled high level signal from said second junction to said second output when in a first position and for connecting both said mixed, level-controlled high level signal from said second junction and said preamplified signal from said amplifier unit tape monitor output to said second output when in a second postion.

17. The audio signal mixing apparatus of claim 13, wherein said manually operable signal coupling means comprises a triple-throw switch connected for coupling only said mixed, level-controlled high level signal from said second junction to said second output when in a first position, for coupling only said pre-amplified signal from said amplifier unit tape monitor output to said second output when in a second position, and for coupling both said mixed, level-controlled high level signal from said second junction and said pre-amplified signal from said amplifier unit tape monitor output to said second output when in a third position.

* * * * *